US005453153A

United States Patent [19]
Fan et al.

[11] Patent Number: 5,453,153
[45] Date of Patent: Sep. 26, 1995

[54] ZONE-MELTING RECRYSTALLIZATION PROCESS

[75] Inventors: John C. C. Fan, Chestnut Hill; Paul M. Zavracky, Norwood, both of Mass.; Jagdish Narayan, Raleigh, N.C.; Lisa P. Allen, Norton, Mass.; Duy-Phach Vu, Taunton, Mass.; Ngwe K. Cheong, Boston, Mass.

[73] Assignee: Kopin Corporation, Taunton, Mass.

[21] Appl. No.: 849,632

[22] Filed: Mar. 5, 1992

Related U.S. Application Data

[63] Continuation of Ser. No. 638,002, Jan. 4, 1991, abandoned, which is a continuation of Ser. No. 351,422, May 12, 1989, abandoned, which is a continuation-in-part of Ser. No. 120,016, Nov. 13, 1987, Pat. No. 4,885,052.

[51] Int. Cl.$^6$ ..................................................... C30B 13/00
[52] U.S. Cl. ......................................................... 117/2; 117/3
[58] Field of Search ............................... 156/603, 605, 156/606, 620.7; 437/10, 16, 20, 21; 148/DIG. 82, DIG. 83

[56] References Cited

U.S. PATENT DOCUMENTS

| | | | |
|---|---|---|---|
| 3,718,502 | 2/1973 | Gibbons | 156/605 |
| 3,909,307 | 8/1975 | Stein | 437/21 |
| 4,330,363 | 5/1982 | Biegesen | 156/620 |
| 4,371,421 | 1/1983 | Fan et al. | 156/624 |
| 4,463,492 | 8/1984 | Maeguchi | 437/21 |
| 4,479,846 | 10/1984 | Smith et al. | 156/603 |
| 4,509,990 | 4/1985 | Vasudev | 148/1.5 |
| 4,522,657 | 6/1985 | Rohatgi et al. | 437/24 |
| 4,561,916 | 12/1985 | Akiyama et al. | 148/175 |
| 4,588,447 | 5/1986 | Golecki | 148/1.5 |
| 4,632,712 | 12/1986 | Fan et al. | 148/175 |
| 4,693,758 | 9/1987 | Kobayashi et al. | 437/174 |
| 4,710,241 | 12/1987 | Komatsu | 437/21 |
| 4,863,877 | 9/1989 | Fan et al. | 156/603 |

FOREIGN PATENT DOCUMENTS

| | | | |
|---|---|---|---|
| 54-47473 | 11/1977 | Japan . | |
| 53-85157 | 7/1978 | Japan | 437/20 |
| 54-47473 | 4/1979 | Japan | 437/20 |

(List continued on next page.)

OTHER PUBLICATIONS

*Appl. Phys. Lett.;* vol. 37, No. 5, 1 Sep. 1980; "Silicon Graphoepitaxy Using a Strip–Heater Oven"; Geis et al.; pp. 454–455.

*Appl. Phys. Lett.;* vol. 38, No. 3, 1 Feb. 1981; "Laser–Induced Crystallization of Silicon Islands on Amorphous Substrates: Multilayer Structures"; Biegelsen et al.; pp. 150–152.

*Silicon Processing For the VLSI Era:* vol. 1; Wolf and Tauber; pp. 305–308.

*VLSI Technology;* Edited by Sze; pp. 220–224 Published by McGraw–Hill, second edition 1988.

"Characterization of Ion–Implantation Damage and Annealing Phenomena in Semiconductors", Narayan et al., *J. Electrochem. Soc., Solid–State Science and Technology,* vol. 131, No. 11, Nov. 1984, pp. 2651–2662.

Ion Implantation and its Applications Re. JA 47–11445 pp. 113–114 (1977).

Wilson, R. G. "Boron, Fluorine, and Carrier Profiles for B, $BF_2$ Implants into Crystalline and Amorphous Si" *J. Appl. Phys.* 54(12), 1983 pp. 6879–6889.

Beanland, D. G. "The Behavior of Boron Molecular Ion Implants into Silicon" *Solid State Electronics* vol. 21 (1978) pp. 537–547.

Jones et al. "A Systematic Analysis of Defects in Ion Implanted Silicon" *Applied Physics A* 1988 vol. 45 pp. 1–34.

*Primary Examiner*—R. Bruce Breneman
*Attorney, Agent, or Firm*—Hamilton, Brook, Smith & Reynolds

[57] ABSTRACT

An improved method of zone-melting recrystallizing of a silicon film on an insulator in which the film is implanted and annealed to achieve a reduction of the density of defects within the film.

13 Claims, 5 Drawing Sheets

FOREIGN PATENT DOCUMENTS

| | | | |
|---|---|---|---|
| 56-33821 | 4/1981 | Japan | 437/21 |
| 57-55207 | 11/1982 | Japan | 437/20 |
| 58-26173 | 6/1983 | Japan | 437/20 |
| 58-151020 | 9/1983 | Japan | 437/20 |
| 61-216320 | 3/1985 | Japan . | |
| 61-43858 | 9/1986 | Japan | 437/20 |
| 61-216320 | 9/1986 | Japan | 437/20 |
| 53-85157 | 1/1987 | Japan . | |
| 57-55207 | 3/1987 | Japan . | |
| WO87/04563 | 7/1987 | United Kingdom . | |
| WO87/04854 | 8/1987 | WIPO . | |

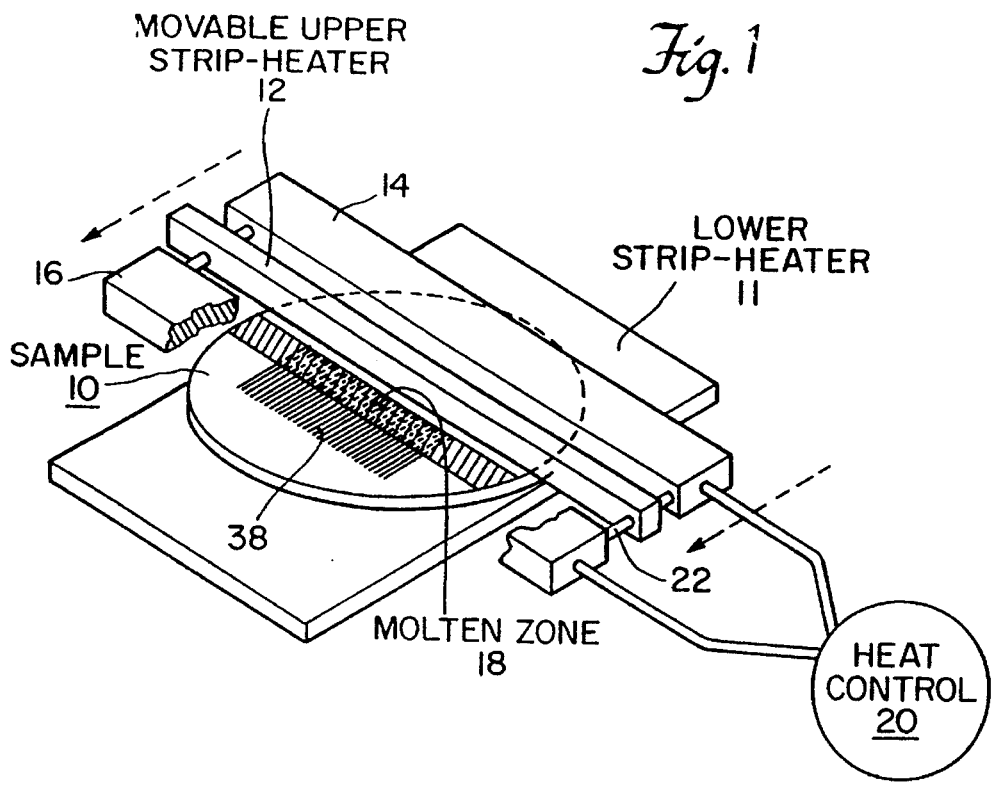
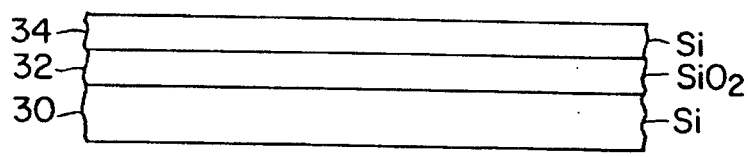
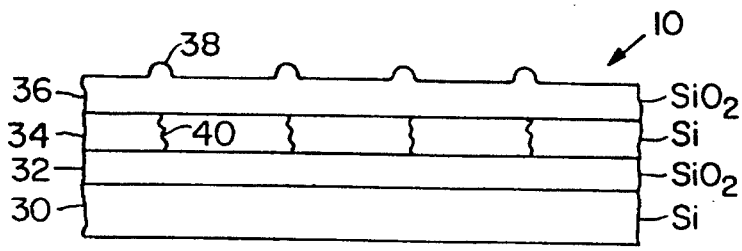
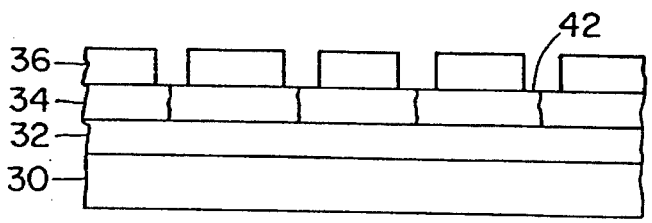
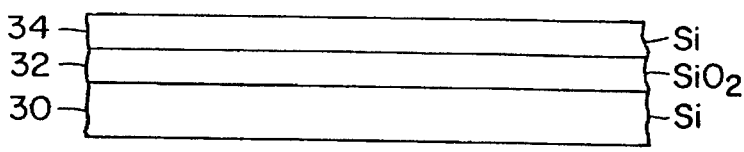

ZONE-MELTING RECRYSTALLIZATION PROCESS

This is a continuation of application Ser. No. 07/638,002, filed on Jan. 4, 1991, now abandoned which is a continuation of Ser. No. 07/351,422 filed May 12, 1989, now abandoned, which is a CIP of Ser. No. 120,016 filed Nov. 13, 1987, now abandoned U.S. Pat. No. 4,885,052.

BACKGROUND ART

Zone-Melting Recrystallization (ZMR) is a process for producing thin crystalline films of silicon (Si) isolated from a silicon substrate by a buried insulating layer, i.e., $SiO_2$. In the ZMR process a layer of $SiO_2$ is deposited on a substrate, often a single-crystal wafer. Polycrystalline Si (polysilicon) is then deposited on the $SiO_2$ layer; followed by deposition of a capping layer or a wetting agent, such as $SiO_2$.

This structure is then subjected to a heat treatment wherein the polysilicon film is melted.

Typically, the heating is performed using a stationary bottom heater adjacent the substrate surface. The stationary heater elevates the temperature of the polysilicon to about 1000° C.–1300° C., near its melting point. A movable upper heating source is then translated past the structure adjacent the capping film to supply sufficient heat to melt the polysilicon as the heating source moves along its path. Upon recrystallization the polysilicon film is transformed to a single, or nearly single crystalline film. Optionally, a single crystal seed material may be used to aid in epitaxial recrystallization. (See U.S. Pat. No. 4,371,421 to Fan et al., and "Silicon Graphoepitaxy Using a Strip-Heater Oven" by M. W. Geis et al., *Appl. Phys. Lett.*, 37 (5) Sep. 1, 1980).

Silicon-on-Insulator material (SOI) prepared by the ZMR technique promises to satisfy the material needs for many important device applications, including radiation-hardened circuits, high voltage circuits, faster computating circuits, and microsensors, etc. Currently, however, ZMR processed SOI wafers have several significant material problems that can potentially limit their wide-spread adoption. The major problems are associated with one or more of the following: surface-edge defects, sub-boundary defects, surface defects, and "warp and slip".

DISCLOSURE OF THE INVENTION

An improved process of ZMR is provided wherein the conventional single upper movable heater is supplemented by lateral fore and aft heaters to provide a shallow thermal gradient. Additionally, defect entrainment strips are formed on the upper encapsulating film so that after ZMR the entrapped defects can be located by etching away the strips. Once located, the defect area is amorphized and re-grown as single crystal defect-free material from the sides. These and other improvements will be described in connection with the drawings. In an optional embodiment, the entrainment strips are not employed and defects are not entrained. Instead, defects are optically located and, once located, the regions are amorphized, as above, and regrown from the sides to be defect-free.

A preferred embodiment utilizes the implantation of light ions without any significant amorphization of the material followed by an annealing step to remove threading dislocations.

Another embodiment employs implantation to amorphize nearly the entire film leaving relatively small crystal regions near or on the surface of the film that serve as seeds for subsequent annealing where a crystallization front moves laterally and downward to form a relatively defect-free, essentially single crystal structure.

DETAILED DESCRIPTION OF THE DRAWINGS

FIG. 1 is a partially cut-away illustration of the ZMR heaters.

FIGS. 2–5 are successive schematic cross-sectional Jews of the ZMR process.

FIG. 7 is a transmission-electron micrograph of a cross-sectional area of Si or $SiO_2$ showing elimination of defects.

DETAILED DESCRIPTION OF THE INVENTION

Figure 6:
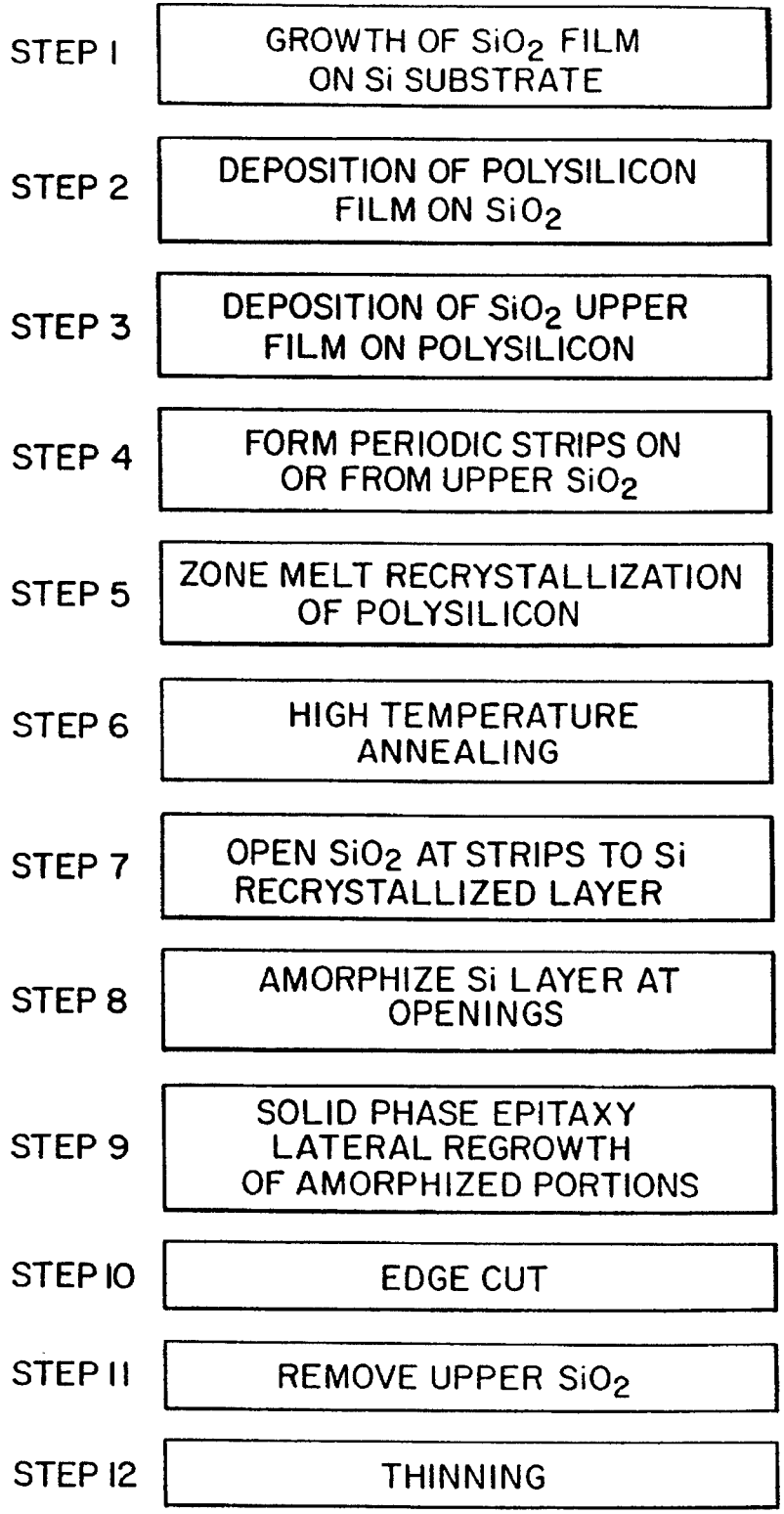
FIG. 6 is a flow chart of the improved ZMR process.

Surface-edge defects are caused by overheating around the edge of a wafer. Under uniform bottom-heater conditions, the upper heater often heats the edges much hotter. The overheating causes the wafer edges to melt and thus produce detrimental effects to photolithography. This is a problem even without seeding. If seeding is used, and the seeding is often done along the edges, the seeding areas (either by scribing, or photolithography) will also often cause either overheating, or other cosmic surface effects, thus affecting device photolithography.

The exact nature of the sub-boundary defects is not known. They may be attributable to thermal or mechanical vibrations in the ZMR process coupled with the sharp thermal gradients, and oxygen presence in the wafers. Nevertheless, it has been observed that the sub-boundaries currently disappear with Si layers thicker than 5 microns, and these sub-boundaries are replaced by dislocation arrays, still located approximately where the sub-boundaries were. The dislocation densities (estimated to be $10^5$–$10^6$ cm$^{-2}$) are mostly threading dislocations. In between these regions, the Si film was found to be essentially defect-free. Sub-boundaries have detrimental effects on gate oxidation and leakage currents in devices. Threading dislocations usually have less detrimental effects than sub-boundaries for devices. However, they still may have detrimental effects on yields in circuits.

Protrusions are surface defects usually located at the sub-boundaries or grain boundaries. Surface protrusions (usually about a few microns across) have adverse effects on photolithography and gate oxidation during device processing.

ZMR wafers often exhibit "slips" in the wafers. They appear to be caused by sharp thermal gradients present in the typical ZMR process. These "slips" are measured to be about a few hundred Å in ZMR samples, causing possible photolithography problems. The "warps" also appear to be caused by the sharp thermal gradients. They are measured to be tens of microns across a 4" or 5"-diameter wafer.

The present invention comprises a series of processing steps which can be combined to provide much improved ZMR wafers and higher processing yield. Inclusion of some or all the steps is a matter of choice depending upon the particular requirements. The improvement steps are as follows:

I. Edge Effects

A quick and easy method for reducing edge effects is to cut the ZMR wafers to a smaller size, thus eliminating all the edge effects. For example, a 5"-diameter wafer can be obtained by trimming a 6"-diameter wafer. The cutting method can be either laser, mechanical, dry or wet chemical etching or ultrasonically. Sand blasting is also very effective. The detailed sand blasting process is outlined as follows:

A ZMR processed wafer is mounted on a jig and $Al_2O_3$ powder blasted at a velocity of about 0.02 m/sec, with $Al_2O_3$ powder of 27 micron sieve size. The $Al_2O_3$ is ejected from a nozzle of about 35 mil diameter with a pressure of 80 PSI. The important wafer surface i.e. the wafer area away from the edge, is protected by a coating of photoresist, or some other resilient material. The wafer is placed about 250 mil from the nozzle. The actual cutting time is less than 90 seconds. By cutting off the edges, desirable stress relief effects have also been observed, and warping is significantly reduced.

II. ZMR Layer Thinning

Currently sub-boundaries occur in Si films of less than 0.5 microns in thickness. It is therefore desirable to prepare ZMR samples with Si films greater than 0.5 microns thick so as to obtain films without sub-boundaries. The thick film is then thinned down for actual device applications. In some device applications, especially for large-scale integrated circuits with small device geometries, a thin Si film is preferred having a thickness of less than 0.3 microns. Thinning the films is preferably accomplished by polishing as follows: The polishing powder used is Syton, with adhesive backing to a polishing pad. A very smooth parallel plate polishing technique must be used to assure a parallel Si film after polishing. Usually polishing also removes and reduces surface protrusion effects. Alternatively, reducing Si film thickness is accomplished by oxidation followed by etching. Either high pressure or low pressure oxidation is employed. The oxidation process must be carefully carried out to retain surface smoothness and uniformity. It can be done with steam oxidation at 950° C., or a dry oxidation in oxygen at 1200° C. With dry oxidation, the oxidation rate is about 4000 Å of $SiO_2$ in 3.5 hours. There is another advantage to dry oxidation; in that it may be combined with high-temperature annealing (to be described later).

For other device applications, such as bipolar, thick films are acceptable, and no thinning is needed.

III. Warp & Slip

To reduce warping and slips, a shallow thermal gradient method is used. Shallow thermal gradients are obtained by using two additional upper heaters 14 and 16 (See FIG. 1) laterally disposed before and after the movable upper heater 12 and translatable therewith.

These two additional upper heaters ideally should be separately thermally controlled and of substantially greater lateral width than the thin single upper heater to provide more symmetrical thermal input in the ZMR process, allowing better process control.

IV. Si Material Defect Reduction

In ZMR films, as above noted, sub-boundaries and threading dislocations are often observed. The exact causes of such crystal defects have not been established. However, it is known that they are present in locations where the recrystallized films are the last to solidify. Previously, the sub-boundaries or dislocations have been entrapped into preselected locations. (See, for example, U.S. Pat. No. 4,479,846 to Smith et al. issued 30 Oct. 1984, which teaches use of an artificial pattern to entrain boundaries.) One such pattern may comprise a periodic raised structure of parallel strips in the underlying $SiO_2$ of the SOI structure. This makes the Si films along these raised structures slightly hotter than the adjacent areas, and thus they become the last area to solidify. Therefore, by having a periodic $SiO_2$ structure, the dislocations or sub-boundaries are localized in preselected areas. Unfortunately, the raised structure in the underlying $SiO_2$ also causes the Si films to have undulating features, which are very detrimental to device fabrication.

Another technique of entrainment is shown in Smith et al. above. In Smith et al. parallel strips of material are formed on the encapsulating layer over the polysilicon. The strips may either be a reflectional coating to thermal or light radiation or may be an absorber. In this former case, the sub-boundaries or defects are entrained away from the shaded strips and in the latter are entrained beneath the strips.

V. ZMR Process

Referring now to FIG. 1 the process and apparatus for improved ZMR will be described in more detail in connection therewith.

In the partially exploded view of FIG. 1, and the successive sectional views of FIGS. 2–5, and process chart of FIG. 6, the basic concepts of improved ZMR are shown. A sample wafer 10 is subjected to a thermal treatment by being disposed on a stationary lower strip-heater 11 while a movable upper strip heater 12 is mechanically translated past the sample 10 in the direction of the arrows. In accordance with the present invention fore and aft heaters 16 and 14 respectively are mechanically coupled to the conventional upper heater 12 and are mechanically translatable therewith. For example, rods or pins 22 may be used to couple the heaters together. Leads 26 and 28 are coupled to heat control unit 20 so that the temperature of heaters 14 and 16 may be controlled separately from each other and from the other units. The purpose of heaters 14 and 16 is to provide a less abrupt, more shallow, thermal gradient as the main upper strip heater 12 is translated past the sample. For example, if the lower heater is maintained at 1100° C. the upper heater 12 is set at about 1600° C. while the fore heater 16 is at 1300° C. and the aft heater at 1400° C.

Under these conditions the top wafer surface first sees a temperature of about 1300° C. before encountering the elevated temperature of the main heater 12.

The wafer 10 is preferably comprised of a single crystal Si substrate 30 upon which a thermally grown layer 32 of $SiO_2$ is formed. (Step 1 FIG. 6) A thin film of polysilicon 34, to be recrystallized, is then deposited on the $SiO_2$ film 32. (Step 2 FIG. 6 and FIG. 2). An encapsulation or wetting agent layer 36 of $SiO_2$ (or $Si_3N_4$, or both) is formed, as by deposition. (Step 3 FIG. 6) An entrainment pattern of raised strips 38, which may preferably be periodic in nature, is then formed on, or in, the encapsulation layer 36. Preferably these strips are formed by etching away $SiO_2$ material from layer 36 between the desired strip locations. (Step 4 FIG. 6). The structure at this point is shown in the section of FIG. 3 and has the advantage that, when the wafer SiO$_2$ layer 36 is subsequently removed by etching; a planar upper layer of Si is left. (See FIG. 5).

The structure thus formed is then subjected to the ZMR process; (Step 5 FIG. 6) whereby a molten zone 18 is created in the polysilicon film 34. This molten zone is moved in a direction parallel to the axis of the entrainment pattern as shown by the arrows in FIG. 1. The molten zone is long and narrow with its long axis perpendicular to the lines of the entrainment pattern. As the molten zone recrystallizes, the polysilicon film 34 is transformed to single crystal, or nearly single crystal silicon, with crystal defects 40 primarily located beneath the strips 38 (See FIG. 3).

The structure shown in FIG. 3 is then subjected to a high temperature anneal in an oxygen ambient at about 1200°–1300° C. Low angle grain boundaries, or sub-boundary, defects are reduced by this treatment; that is, individual sub-grains are better aligned with each other. In addition, stacking faults and twins are found to be eliminated or much reduced with this annealing step. Using X-ray rocking curve measurement, the FWHM (full-width-half-maximum) was measured to decrease from 140 arc-second to 20 arc-second after annealing in oxygen ambient at 1200° C. for 1 hour. The narrow FWHM indicates a much improved crystallinity in the samples. However, threading dislocations and sub-boundaries that originate and end on both overlying and underlying SiO$_2$ interfaces cannot be annealed off. They are eliminated by the following procedure: (Step 6 FIG. 6)

The strips 38 in the encapsulating SiO$_2$ layer 36 are etched away to expose the upper surface 42 of the recrystallized Si film 34 at the localized area of the defects. (See FIG. 4 and Step 7 FIG. 6)

The next step is to amorphize the Si region underlying the exposed upper surface by providing an ion implant of Si sufficient to amorphize the exposed Si strips 42. For this purpose, $^{30}$Si$^+$ ions are preferably used as implantation species so as to avoid N$_2^+$ and CO$^+$ impurity ion implantations. Typically, for a 0.5 micron Si layer, a complete amorphization occurs at a dose equal to or higher than 1×10 cm$^{-2}$ for 200 keV ions. (Step 8 FIG. 6) Note that the regions on each side of the amorphized area are protected from amorphization by the remaining portion of the SiO$_2$ layer 36, which acts as a partial barrier to penetration of the unfocused ion dosage.

A solid phase epitaxy process (SPE) at about 500°–700° C. in N$_2$ or Ar is then employed to transform the amorphous strips 42 to single crystal Si by regrowth from both sides of the amorphized region. (Step 9 FIG. 6). The lateral growth rate for Si (undoped) is given by the following equation:

$$u \text{ (growth rate)} = 2.89 \times 10^8 \exp \frac{-2.68 \pm 0.05 \text{ eV}}{kT} \text{ cm/sec}$$

where k=Boltzmann's constant and T=absolute temperature in °K. Solving this equation at 550° C. annealing temperature, u=1 Å/sec. For a 3 micron strip, about 5 hours are required for lateral growth from both sides at 550° C. Using this process of entrainment, followed by implantation and SPE from defect-free areas, the sub-boundaries and crystal defects have been eliminated. In a transmission electron micrograph of an area of Si film (labelled A) or SiO$_2$ (labelled A) wherein after ion-implantation and SPE, no defects were observed; whereas there were dislocations before said treatment in this area.

One can also use rapid thermal annealing to perform SPE. In this case, the growth rate at 1100° C. can be over tens of microns per second.

Preferably, the structure is then processed by removing the remaining StO$_2$ layer 36 (Step 10 FIG. 6) and then edge cutting and thinning the wafer 10 (Step 11 FIG. 6) to produce a defect-free SOI structure as shown in FIG. 5.

Alternately, instead of entrapping defects with entrainment strips, it is possible to optically locate defects in ZMR films. The recrystallized Si films are found to have a slight thickness variation after zone melting. The Si thickness is usually different from the rest of the film in the regions of defect trails. Usually, the film is thinner, by about 100–200 Å, in the regions of defect trails. This variation can be readily observed by optical microscope, especially in Nomalski or other interference contrast mode. With this observation, using optical microscopy, the defect trails can be located. Once located, a focussed ion implantation beam, such as an Si beam, can be directed to the defect region to amorphize these areas. Then the amorphized structure is regrown by SPE, as described above in connection with the strip embodiment. The SPE regrowth is seeded by the laterally adjacent single crystal regions on all sides of the amorphized region of the film, producing a substantially defect-free Si film.

In an alternative procedure, a semi-transparent mask can be placed over the zone-crystallized film. Because of the difference in thickness at the defect trails, an optical interference pattern is formed when the mask is illuminated by a collimated beam. This pattern is used to expose only the defect trail regions, which have different thicknesses than the rest of the film. One can then amorphize the defect trail regions, as previously described, and then SPE the defects, as also described above.

With either of the above two methods, or variations thereof, one can amorphize the defect trail regions automatically, without having to initially entrain them, and then locate the entrained regions.

The whole concept of ion-implanting defected areas of the film and then annealing the defects off is especially effective for thin films, such as below 2500 Å. This is because it is much easier to amorphize a thin film by ion-implantation than a thicker film. For example, by using a 100 keV Si beam, a 2500 Å thick St film can be amorphized.

In an experimental sample, ZMR silicon samples (Si layer 3000 Å thick) were implanted with $^{30}$Si+ at an energy of 180 KeV to a dose of 7×10$^{14}$/cm$^2$. This dose amorphized almost the entire layer within which defects, such as dislocations, lose their identity. Solid phase epitaxial (SPE) regrowth in silicon has a considerably lesser activation energy (about 2.7 eV) compared to random nucleation and growth processes (the rate of random recrystallization characterized by an activation energy of about 3.9 eV). Consequently, at a growth temperature of 600° C., regrowth of a 3000 Å layer takes place exclusively by solid phase epitaxial regrowth. The microstructure studies obtained after annealing at 600° C. for 30 minutes showed no crystalline defects in regions, whereas there were defects before amorphization.

Another preferred embodiment of the invention relates to a method of reducing threading dislocations in zone melt recrystallized silicon utilizing the implantation of light ions, such as B$^+$, P$^+$ and Si$^+$, followed by high temperature annealing to reorder the lattice. Unlike standard amorphization techniques used in silicon-on-sapphire structures to amorphize the interface layer adjacent the underlying insulator, the present implantation process does not create an amorphous layer. Rather, the thickness of the film and the implant dosage are selected to effect damage to the crystal such as dislocation loops or tangles without creating an amorphous region. The implantation energy is chosen such that the projected range of the ions is located near the middle, or between the middle and the upper surface, of the film. This leaves a film having single crystal regions throughout the film which are interspersed with crystal defects in the form of threading dislocations and dislocation loops or tangles.

If the film is then annealed, the two types of defects present in the film react to create a substantially defect-free material. A typical dislocation reaction can have the form:

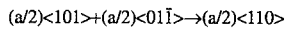

$$(a/2)<101>+(a/2)<01\bar{1}>\rightarrow(a/2)<110>$$

where the defects in two crystallization planes react to form the desired crystal structure. This reaction results in a large reduction in the elastic energy of the film.

Figure 7A:
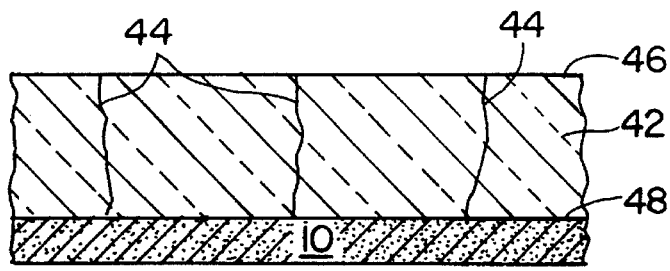
FIGS. 7a–7c show successive schematic cross-sectional views of a preferred embodiment of the implantation and annealing process.
Figure 7B:
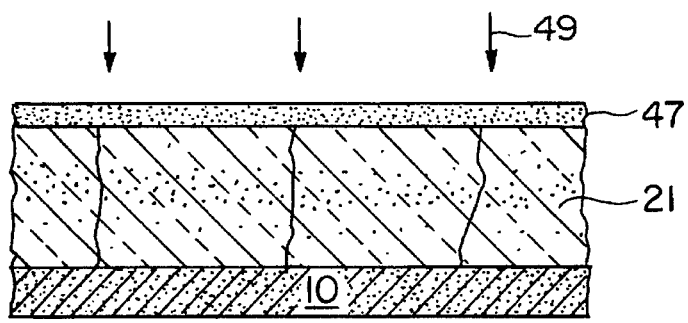
Figure 7C:
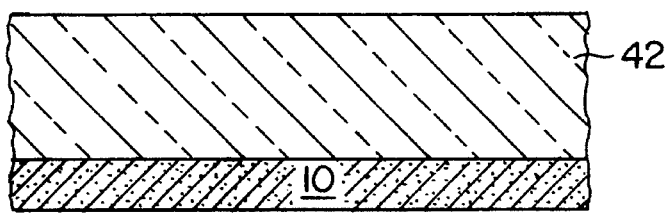

FIGS. 7a–7c show a process sequence illustrating the fabrication steps of the present invention. FIG. 7a shows a cross-sectional view of a zone recrystallized film 12 formed on an insulating substrate 10. The film 12 is generally single crystal except for a number of threading dislocations which extend from the upper surface 16 of film 12 to the interface 18 between the film 12 and the insulator 10. A light ion implantation 19 is performed, as shown in FIG. 7b, through a thin oxide layer 17, typically 500 Å, formed on top of the Si film 12 and the wafer is rotated 3°–7° off-orientation to avoid a channeling effect. The implantation energy is chosen such that the projected range of implantation $R_p$ is located near the middle of the film thickness. For example, with phosphorus ions ($P^+$) implanted at 200 keV, the Si film thickness is about 0.5 microns so that the implanted ions are most concentrated at a depth of about 0.25 microns. Following the implantation, an annealing step in a high temperature furnace under oxygen ambient removes the threading dislocations as shown in FIG. 7c. Typical annealing conditions are 1000° C./1 hour.

For a sample having an Si film thickness of 0.4 microns, phosphorus was implanted with a dose of $4\times10^{15}$ cm$^{-2}$ and an energy of 200 keV. The annealing was performed at 1000° C. for 1 hour in oxygen ambient. The sample had areas masked against ion implantation. Pits corresponding to the threading dislocations in the unimplanted side were visible while the implanted side is clear of these defects. No threading dislocations were observed in the implanted side. A few dislocation loops can result near the buried silicon-silicon dioxide interface but they are known to result from the tail of the implantation profile. They can be easily removed by optimizing the implantation and annealing conditions such as choosing the appropriate substrate temperature during implantation. For example, room temperature and low beam current are appropriate and can be provided with a good heat sink used as the wafer support.

The process described is useful for fabricating SOI materials for many applications. For example, the Si implanted film is appropriate for CMOS. For this technology, the starting wafers must be intrinsic or lowly doped, allowing one to use implantation to adjust threshold voltages for both the n-channel and p-channel transistors. Also, the phosphorus or boron implanted film can be used for bipolar applications. The implanted layer is used as the n$^+$/p$^+$ buried layer for a lowly doped epitaxial Si film will be grown on top of it. Another application for the implanted and annealed material is to use the dislocation loops located near the back silicon-silicon dioxide interface in conjunction with the $SiO_x$ precipitates as gettering centers for metallic impurities.

Figure 8:
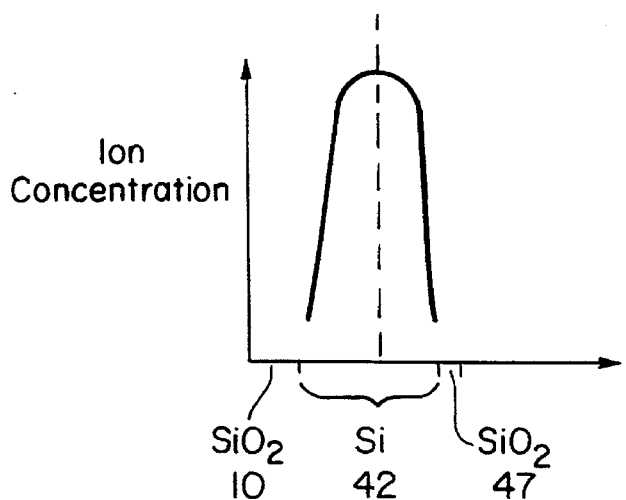
FIG. 8 shows schematic profile of the ion concentration for the implant of FIG. 7b as a function of depth in the film.

Another preferred embodiment of the invention utilizes heavy ion implantation to create damage in the form of an amorphous region that is centered about the middle of the film. This is accomplished by increasing the dose such that an amorphous layer is initiated at the center of the film and broadens on both sides towards the surface and the underlying insulator. A profile of the ion concentration for an implant as a function of depth in the film is shown in FIG. 8. Antinomy and arsenic can be used as well as Si$^+$ and P$^+$ ions where the latter two ions require a lower dose rate and substrate temperature.

At a critical dose the entire silicon film is amorphized except for a few crystalline islands or microcrystalline regions concentrated near the surface. This results in the removal of threading dislocations extending through the film. The implantations damage is then removed by annealing the film using the crystalline islands as seed material for solid phase epitaxy. A crystallization front is created at the interface between the seed and amorphous regions that moves laterally and downward toward the insulator interface. Solid phase epitaxy occurs at about 600° C. for between 30 minutes and several hours depending on the film thickness.

Figure 9A:
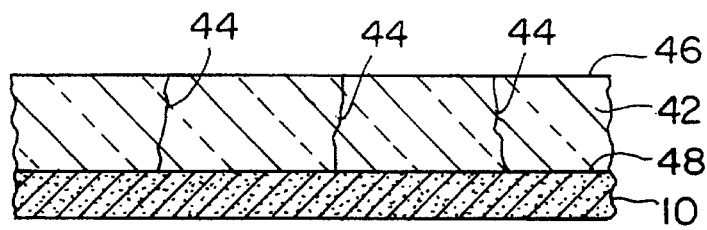
FIGS. 9a–9e show successive schematic cross-sectional views of another preferred embodiment for implanting and annealing to reduce defects.

FIGS. 9a–9e show the process sequence for fabricating the defect reduced SOI structure of this embodiment. FIG. 9a shows a zone melt recrystallized thin film silicon layer 12 formed on an insulating substrate 10 where threading dislocations 14 extend from the surface 16 of the film 12 down to the interface 18 between the substrate 10 and the film 12.

Figure 9B:
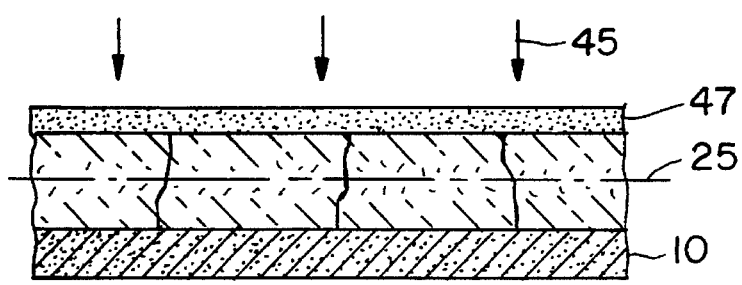
Figure 9C:
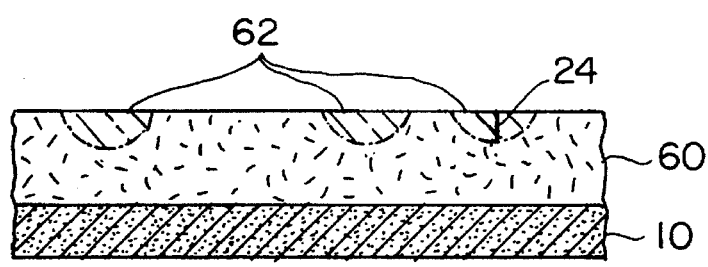
Figure 9D:
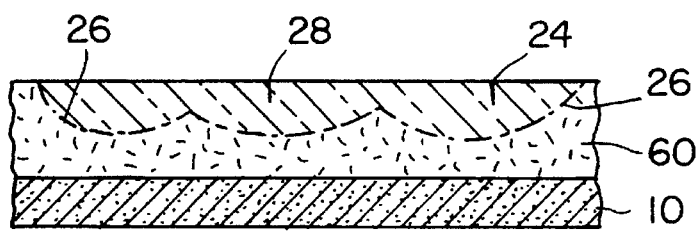
Figure 9E:
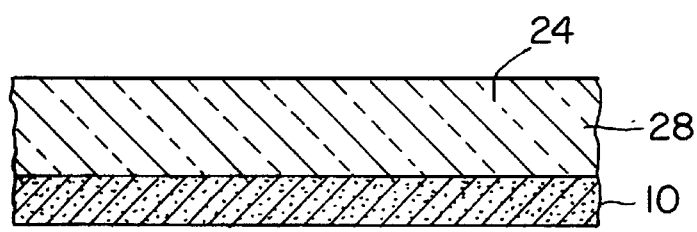

In FIG. 9b an oxide layer 17 is formed on the surface 16 and heavier 15 ions are implanted to initiate amorphization near the center of the film along plane 25. As the implantation continues, the amorphization region broadens above and below the plane 25 to form the structure 20 of FIG. 9c which is extensively amorphized except for crystalline regions or islands 22 near or on the surface 16 which can retain residual dislocations 24. The crystalline regions 22 are then used as a seed during annealing, as shown in FIG. 9d, such that a crystallization front 26 moves laterally and downward to crystallize the entire film. This forms a substantially defect free structure 28 as shown in FIG. 9e.

Figure 10:
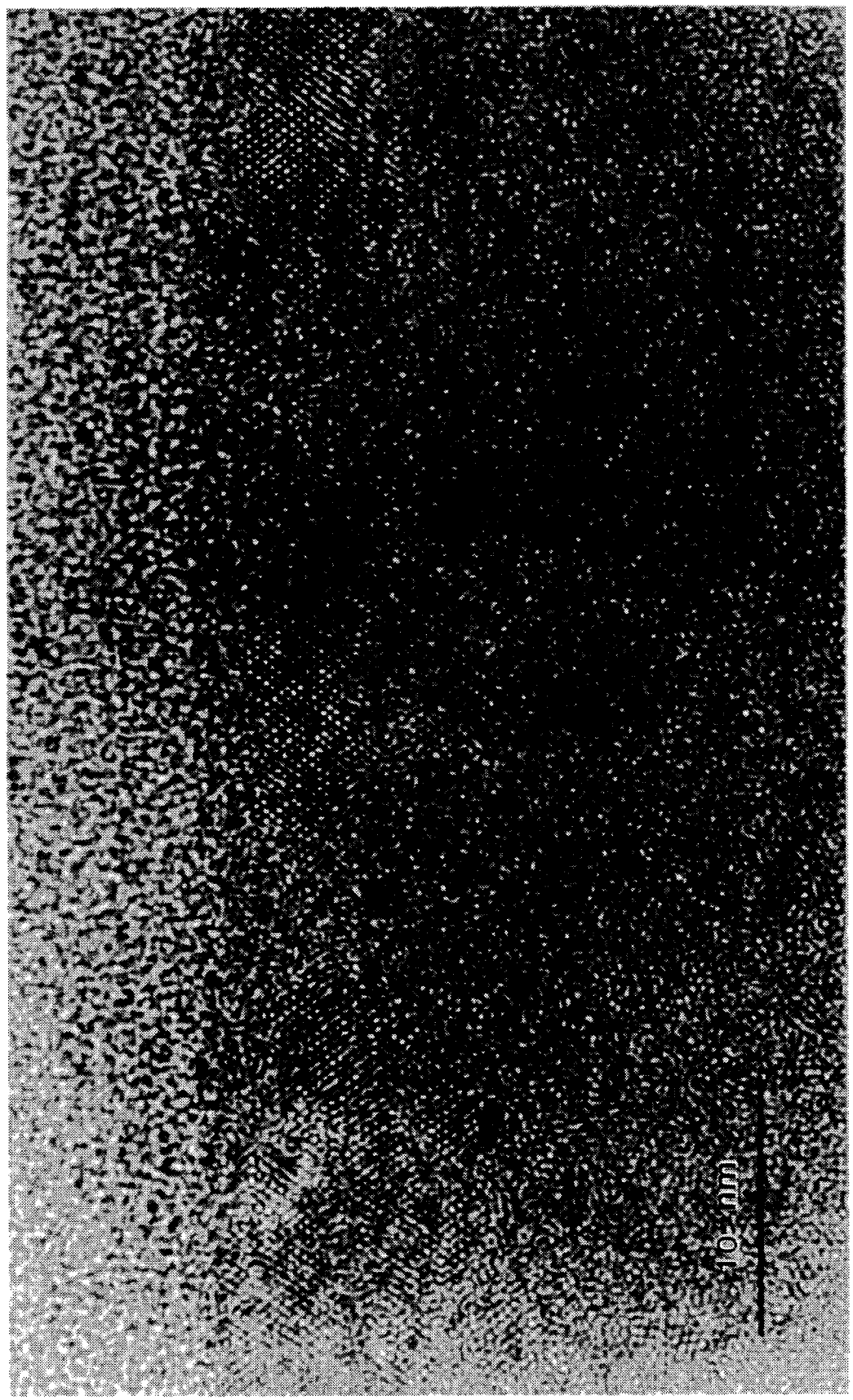
FIG. 10 is a transmission-electron micrograph of a cross-sectional area showing residual crystal regions in a largely amorphous structure.

FIG. 10 is a transmission electron micrograph showing crystal regions R within a substantially amorphized silicon structure S and underlying an oxide O formed over the film prior to implantation. The film can then be annealed in accordance with the invention where the regions R act as seeds for crystallization.

Equivalents

This completes the description of the preferred embodiments of the invention. While the invention has been particularly shown and described with reference to such embodiments, it should be understood that those skilled in the art will be capable of devising various changes in form and detail without departing from the spirit and scope of the invention. For example, a Si semiconductor film and substrate has been used in reference to the preferred embodiments. Other semiconductor materials are contemplated within the scope of the invention, such as compound semiconductors of III–V materials; in particular, GaAs or alloys thereof. Furthermore, the $SiO_2$ insulator may be replaced by other materials, such as sapphire, to produce an SOS structure instead of an SOI structure.

What is claimed is:

1. A method of reducing defect density within a silicon film formed on a insulator comprising:
   forming a non-single crystal silicon material on an insulating substrate;
   recrystallizing the non-single crystal silicon material to provide a layer of single crystal silicon having threading dislocations extending through the film between an upper surface of the film and an interface with the underlying insulator;
   implanting the film with silicon ions such that additional defects are formed in the film without substantially amorphizing the film; and
   annealing the film such that the threading dislocations react with the implanted ions to remove threading dislocations and implanted defects from the single crystal silicon film.

2. The method of claim 1 wherein the implanted defects have a maximum defect density near a central region of the film.

3. The method of claim 1 wherein the ions to be implanted are selected from the group consisting of boron, phosphorus and silicon.

4. The method of claim 1 wherein the surface of the film is rotated off an axis defining a direction of implantation to reduce channeling of the implanted ions.

5. The method of claim 1 further comprising forming a thin dielectric layer over the surface of the film prior to implantation.

6. A method of reducing defect density within a semiconductor film formed on an insulator comprising:
   forming a non-single crystal semiconductor material on an insulating substrate;
   recrystallizing the material to form a single crystal region having threading dislocations extending through the film between an upper surface of the film and an interface with the underlying insulator;
   implanting the film with ions of selected energy such that additional defects are formed in the film without substantially amorphizing the film; and
   annealing the film such that the threading dislocations react with the implanted ions to remove threading dislocations and implanted defects from the improved single crystal film.

7. The method of claim 6 wherein the implanted defects have a maximum defect density near a central region of the film.

8. The method of claim 6 wherein the ions to be implanted are selected from the group consisting of a doping material and the semiconductor material.

9. The method of claim 6 wherein the surface of the film is rotated off an axis defining a direction of implantation to reduce channeling of the implanted ions.

10. The method of claim 6 further comprising forming a thin dielectric layer over the surface of the film prior to implantation.

11. A method of reducing defect the density within crystallized silicon film comprising:
    zone-melting recrystallizing a non-single crystal silicon semiconductor material to provide a single crystal silicon semiconductor material on a supporting substrate, the silicon material having threading dislocations extending between an upper surface and an underlying insulator;
    implanting the single crystal silicon material with silicons ions to induce defects in the single crystal material without amorphization; and
    annealing the material to reduce the density of defects such that threading dislocations within the material have been removed.

12. The method of claim 11 further comprising rotating a surface of the silicon material off of a plane orthogonal to an axis defining a direction of implantation during the implanting step.

13. The method of claim 11 further comprising forming a dielectric layer over a surface of the silicon material to be implanted.

* * * * *